United States Patent
Yang et al.

(10) Patent No.: US 6,828,219 B2
(45) Date of Patent: Dec. 7, 2004

(54) STACKED SPACER STRUCTURE AND PROCESS

(75) Inventors: Shih-Hsien Yang, Hsinchu (TW); Yueh-Cheng Chuang, Hsinchu (TW); Bor-Ru Sheu, Hsinchu (TW)

(73) Assignee: Winbond Electronics Corporation (TW)

( * ) Notice: Subject to any disclaimer, the term of this patent is extended or adjusted under 35 U.S.C. 154(b) by 16 days.

(21) Appl. No.: 10/102,742

(22) Filed: Mar. 22, 2002

(65) Prior Publication Data

US 2003/0178688 A1 Sep. 25, 2003

(51) Int. Cl.[7] .......................................... H01L 21/3205
(52) U.S. Cl. ...................... 438/595; 438/294; 438/303; 438/585; 438/639
(58) Field of Search .................. 438/585, 535, 438/639, 294, 303

(56) References Cited

U.S. PATENT DOCUMENTS 6,281,073 B1 * 8/2001 Lee ............................. 438/255
6,326,270 B1 * 12/2001 Lee et al. .................... 438/279
6,380,042 B1 * 4/2002 Huang ......................... 438/303
6,448,140 B1 * 9/2002 Liaw ........................... 438/279
6,562,676 B1 * 5/2003 Ju ............................... 438/232
6,573,551 B1 * 6/2003 Kim et al. ................... 257/306
6,627,504 B1 * 9/2003 Bertrand et al. ............. 438/303

* cited by examiner

Primary Examiner—Tom Thomas
Assistant Examiner—N. Drew Richards
(74) Attorney, Agent, or Firm—Dickinson Wright PLLC

(57) ABSTRACT

A stacked spacer structure and process adapted for a stacked layer on a semiconductor substrate is described. The stacked spacer structure is formed on the sidewalls of the stacked layer which comprise a conductive layer and a cap layer thereon. A dielectric layer made of a material with low dielectric constant lower than that of silicon nitride is formed on the semiconductor substrate. A first silicon nitride layer is then formed over the substrate. The first silicon nitride layer and dielectric layer are etched sequentially to form an inner spacer on the sidewalls of the stacked layer. A second silicon nitride layer is formed over the substrate and is etched to form an outer spacer on the sidewalls of the inner spacer. By forming the stacked spacer structure of the present invention embedded in low dielectric material, the coupling capacitance produced therein will be greatly reduced.

24 Claims, 4 Drawing Sheets

STACKED SPACER STRUCTURE AND PROCESS

FIELD OF THE INVENTION

The present invention relates to a semiconductor device structure and to the process for forming the structure, and more particularly to a stacked spacer structure and process for its formation, which can effectively reduce coupling capacitance.

BACKGROUND OF THE INVENTION

The computer and the electronic industry consistently demand of increased overall speed as well as lower fabrication costs for integrated circuits. As far as a computer is concerned, doubtlessly, the integrated circuits, such as Dynamic Random Access Memory (DRAM), play a crucial role. A great number of DRAM memory cells are usually required, and thus they are a vital factor for determining the I/O speed of the computer. Hence, pursuing the miniaturization of the DRAM devices so as to lower costs as well as attain a high-speed performance is one major goal in the industry.

The miniaturization of devices according to a scaling rule is used in a semiconductor device to achieve large-scale integration and high-speed operation. The semiconductor industry is continually striving to improve the performance of MOSFET devices. The ability to create devices with sub-micron features has allowed significant decreases in performance by degrading parasitic capacitance and resistance to be achieved, thus resulting in performance benefits. The attainment of sub-micron features has been accomplished via advances in several semiconductor fabrication disciplines. An example is self-aligned MOSFET devices, which are generally fabricated by forming a polysilicon gate electrode having self-aligned source/drain contact (SAC) areas adjacent to the gate electrode. These self-aligned MOSFET devices are preferred because of their small size, high packing density, low power consumption and low manufacturing cost.

Conventional self-aligned MOSFET devices are typically fabricated by patterning a stacked gate electrode layer comprised of a polysilicon layer and a silicon oxide cap layer over a gate oxide on the device areas of a single crystal semiconductor substrate. Insulating sidewall spacers, usually composed of silicon oxide, are formed next on the sidewalls of the stacked gate and insolate the conductive gate electrode layer from the adjacent SAC plugs.

Unfortunately, one problem occurs because much thinner oxide sidewall spacers are used to achieve the higher device density. A cleaning step is used to remove any native oxide left on the substrate, and the thin oxide sidewall spacers are attacked resulting in electrical shorts between the SAC plug and gate electrode.

Several methods for improving the self-aligned MOSFET devices are provided. A silicon nitride spacer is employed to replace the oxide sidewall spacer. Although the nitride sidewall spacer can be an etching stopper film that minimizes spacer consumption, a high dielectric constant of about 7 for the nitride sidewall spacer results in a serious coupling capacitance that also decreases the operation speed of devices as feature size enters the sub-half micron generation. Thus, this limits the degree to which the integrated density can be scaled down.

Therefore, there is still a strong need for thinner spacers with low coupling capacitance and improved electrical isolation in the semiconductor industry to provide more reliable self-aligned MOSFET devices or electrical interconnections.

SUMMARY OF THE INVENTION

It is an object of the present invention to provide a stacked spacer structure to effectively isolate a conductive gate from a neighboring conductive layer by reducing gate sidewall spacer consumption during the etching process.

It is another object of the present invention to provide a stacked spacer structure to reduce coupling capacitance between two adjacent conductive layers by decreasing the effective dielectric constant.

In one aspect, the present invention provides a method of fabricating a stacked spacer structure. The method comprises the following steps. A semiconductor substrate having at least one stacked layer is provided. The stacked layer is composed of a conductive layer and a cap layer thereon. A dielectric layer substantially higher than the conductive layer is formed on the substrate. A first silicon nitride layer is then formed over the substrate. The first silicon nitride layer and the dielectric layer are sequentially etched to form a first spacer on the sidewalls of the stack layer. A second silicon nitride layer is formed over the substrate, and then is etched to form a second spacer on the sidewalls of the first spacer.

In another aspect, the present invention provides a method of fabricating a stacked spacer structure. The method comprises the following steps. A stacked layer having a conductive layer and a first dielectric layer thereon is formed on a semiconductor substrate. A second dielectric layer substantially higher than the conductive layer is formed on the substrate. A third dielectric layer is then formed over the substrate. The third dielectric layer and the second dielectric layer are sequentially etched to form a first spacer on the sidewalls of the stacked layer. A fourth dielectric layer is formed over the substrate and is etched to form a second spacer on the sidewalls of the first spacer. The second dielectric layer has a dielectric constant lower than that of the first, third and fourth dielectric layers.

In a further aspect, the present invention provides a stacked spacer structure on the sidewalls of a stacked layer formed on a semiconductor substrate. The stacked layer comprises a conductive layer and a cap layer thereon. A low dielectric bottom portion substantially higher than the conductive layer is formed on the substrate and on the sidewalls of the stacked layer. A silicon nitride top portion is formed on the low dielectric bottom portion and on the sidewalls of the stacked layer. The silicon nitride top portion and the low dielectric bottom portion construct an inner spacer. A silicon nitride outer portion is formed on the sidewalls of the low dielectric bottom portion and the silicon nitride top portion.

In a yet another aspect, the present invention provides a semiconductor structure adapted for a semiconductor substrate. At least one stacked layer comprising a conductive layer and a first dielectric layer is formed on the semiconductor substrate. A second dielectric layer substantially higher than the conductive layer is formed on the substrate and on the sidewalls of the stacked layer. A third dielectric layer is formed on the second dielectric layer and on the sidewalls of the stacked layer. The second and third dielectric layers construct an inner spacer. A fourth dielectric layer is formed on the sidewalls of the second and third dielectric layer. The second dielectric layer has a dielectric constant lower than that of the first, third and fourth dielectric layers.

The stacked spacer structure of the present invention can shrink the width of the stacked spacer and reduce coupling capacitance by embedding low dielectric constant material inside the spacer structure.

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein.

DETAILED DESCRIPTION OF THE PREFERRED EMBODIMENT

The present invention provides a stacked spacer structure in which a low dielectric bottom portion is formed under a silicon nitride top portion and a silicon nitride outer portion covered thereon to reduce the equivalent dielectric constant. Furthermore, by precisely controlling and shrinking the width of the stacked spacer structure, device dimension is reduced and thus the integrated density is improved.

Figure 1A:
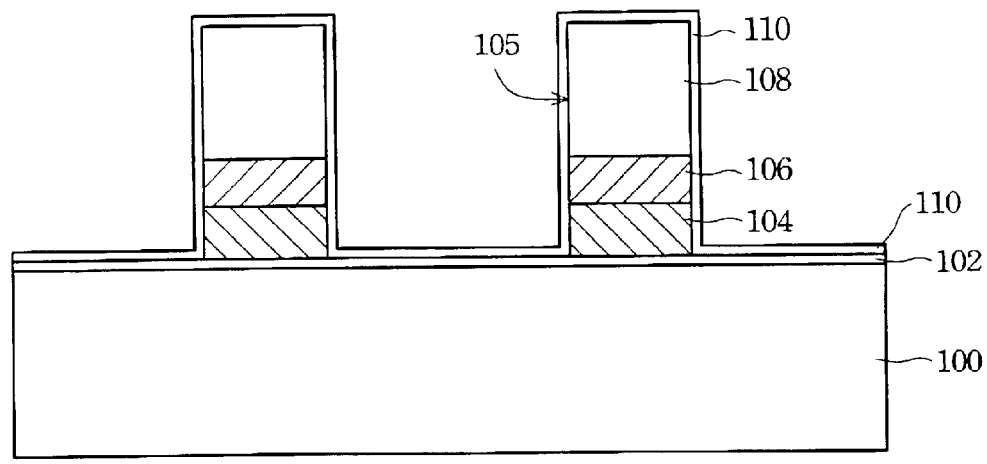
FIGS. 1A–1D are schematic, cross-sectional views according to one preferred embodiment of the present invention.

FIGS. 1A–1D are schematic, cross-sectional views according to one preferred embodiment of the claimed invention. Referring to FIG. 1A, a semiconductor substrate 100 such as a silicon substrate with a <100> lattice orientation is provided. A stacked gate layer, e.g., a word line or a branch connecting to the word line, is formed on an active area (not shown) of the substrate 100 after completing device isolation. The stacked gate layer comprises a gate dielectric layer, a gate conductive layer and a gate cap layer, stacked from bottom to top, respectively. The gate dielectric layer can be, for example, a silicon oxide layer 102 formed by thermal oxidation. The gate conductive layer can be, for example, a stacked layer of polysilicon 104 and tungsten 106. The gate cap layer can be a dielectric layer, for example, a silicon nitride layer 108, a silicon oxy-nitride layer, or layers of other material having high etching selectivity to subsequently formed dielectric layers, and preferably to the silicon nitride layer 108. The method of fabricating the stacked gate layer can be according to the following exemplary steps. A silicon oxide layer, a polysilicon layer, a tungsten layer and a silicon nitride layer are formed in sequence on the substrate 100. Conventional photolithography and etching technologies are employed to define the desired pattern of the stacked gate layers. A thin liner layer 110, such as a silicon nitride layer, having a thickness of about 3–30 nm can be optionally formed over the substrate 100 to cover the sidewalls 105 of the stacked gate layer.

Figure 1B:
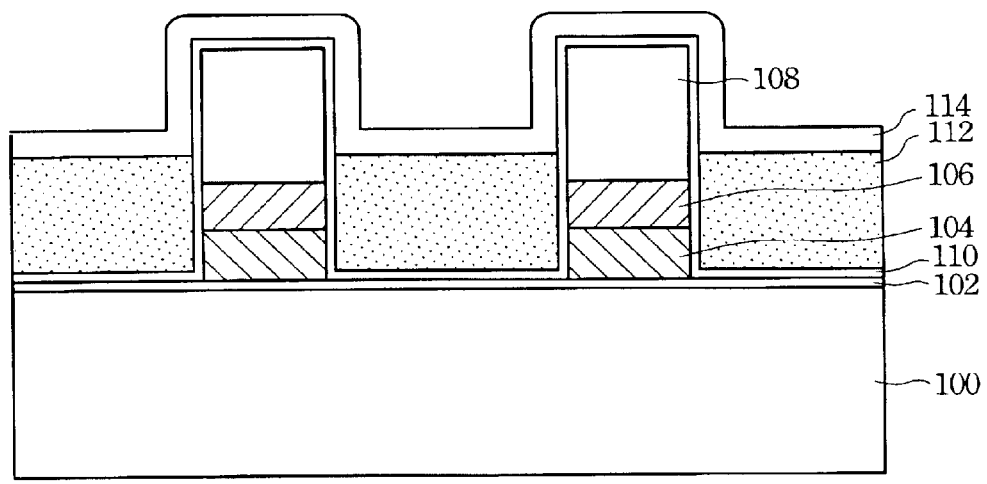

Referring to FIG. 1B, a dielectric layer 112 substantially higher than the gate conductive layer (i.e., the stack of the polysilicon layer 104 and the tungsten layer 106 in FIG. 1A) is formed on the substrate 100 in the access areas between adjacent stacked gate layers. The dielectric layer 112 is made of low dielectric materials with a dielectric constant lower than that of the gate cap layer 108. If the gate cap layer 108 is made of silicon nitride, the dielectric layer 112 must be a material with dielectric constant lower than 7. The dielectric layer 112 can be made of, for example, silicon oxide having a dielectric constant of about 4, or another material having a dielectric constant lower than silicon oxide, such as spin-on glass (SOG), spin-on polymer (SOP), etc., and the fabricating method of that is not limited. For example, a dielectric layer is formed over the substrate 100, and then the portion of the dielectric layer on the stacked gate layers is removed by blanket etching with a suitable etching rate to leave the required portion of the dielectric layer 112.

Another thin dielectric layer 114 is formed over and conformal to the substrate 100. The thickness of the dielectric layer 114 can be precisely controlled to obtain thin gate sidewall spacers. The dielectric layer 114 can be made of silicon nitride, silicon oxy-nitride, or other materials having perfect thickness control and having high etching selectivity to subsequently formed dielectric layers, and preferably to silicon nitride. If the dielectric layer 114 is a silicon nitride layer made by chemical vapor deposition (CVD), the dielectric layer 114 will be much thinner and may even have a thickness of 5–60 nm or less, because thickness control of silicon nitride layer is better than that of the silicon oxide layer.

Figure 1C:
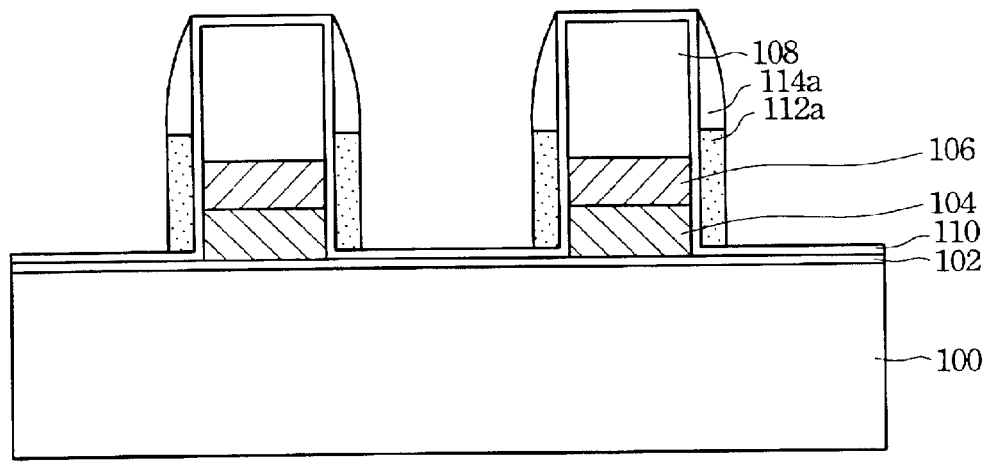

Referring to FIG. 1C, the dielectric layer 114 is then etched back to form a spacer top portion 114a on the sidewalls 105 of the stacked gate layer. The portions of the dielectric layer 114 on the gate cap layer 108 and substrate 100 can be removed by, for example, reactive ion etching (RIE) to leave desired portions on the sidewalls 105 of the stacked gate layer. The exposed portion of the underlying dielectric layer 112 is subsequently etched by using the spacer top portion 114a as a mask to form a spacer bottom portion 112a thereunder. The resulting spacer top portion 114a and spacer bottom portion 112a construct an inner spacer on the sidewalls 105 of the stacked gate layer. Since a material having a high selectivity to the dielectric layer 112 is specifically selected for the spacer top portion 114a, less spacer top portion 114a is consumed during the etching process on the dielectric layer 112. Therefore, damage to the spacer top portion 114a is decreased. In addition, if a silicon nitride liner layer 110 is previously formed, the process of etching the dielectric layer 112 can be self-stopped on the silicon nitride liner layer 110.

Figure 1D:
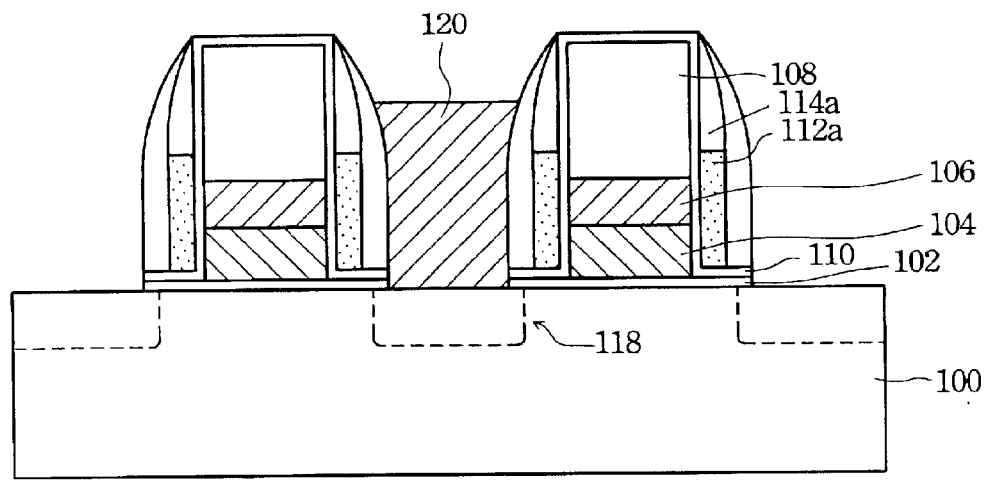

Referring to FIG. 1D, an outer spacer 116 is then formed on the sidewalls of the inner spacer, which includes the spacer top portion 114a and spacer bottom portion 112a. The outer spacer 116 is made of a material having high selectivity to a subsequently formed dielectric layer, e.g., a silicon oxide layer. For example, the outer spacer 116 can be made of silicon nitride, silicon oxy-nitride, or the like. The method of fabricating the outer spacer 116 can be according to the following exemplary steps. A silicon nitride layer is formed over the substrate 100 to cover the inner spacer and then the portion of the silicon nitride layer on the stacked gate layer and substrate 100 is removed by an etching back process to leave the required portion on the sidewalls of the inner spacer.

Thereafter, a source/drain region 118 is formed in the substrate 100 between adjacent stacked gate layers by a process such as ion implantation. The dielectric layers above the source/drain region 118 are removed. A conductive layer 120, such as a conductive wire or a contact plug, is formed on the source/drain region 118, and achieves electrical connection therebetween.

Referring to FIG. 1D again, the stacked spacer structure is therefore provided according to the preferred embodiment of the present invention. The stacked spacer structure as described in the foregoing is formed on the sidewalls of the stacked gate layer including a gate dielectric layer, a gate conductive layer and a gate cap layer, in which the gate cap layer is referred to as a first dielectric layer. The stacked spacer structure of the present invention, as shown in FIG. 1D, comprises second, third and fourth dielectric layers. The second dielectric layer is a low dielectric bottom portion, i.e., the spacer bottom portion 112a described above, is formed on the substrate 100 and on the sidewalls of the stacked gate layer. The low dielectric bottom portion 112a is equal to or higher than the gate conductive layer, and preferably a little higher than the gate conductive layer. The third dielectric layer is a silicon nitride top portion, i.e., the spacer top portion 114a described above, formed on the low dielectric bottom portion 112a and on the sidewalls of the stacked gate layer. The silicon nitride top portion 114a and the low dielectric bottom portion 112a construct the inner spacer. The fourth dielectric layer is a silicon nitride outer portion, i.e., the outer spacer 116 describe above, formed on the sidewalls of the silicon nitride top portion 114a and low dielectric bottom portion 112a to cover the whole inner spacer.

Since the low dielectric bottom portion 112a has dielectric constant lower than the silicon nitride top portion 114a and silicon nitride outer portion 116, the equivalent dielectric constant of the stacked spacer structure is lower than a spacer made of silicon nitride only. Accordingly, the effective spacer thickness of the stacked spacer structure becomes larger than the silicon nitride spacer does at the same width. Hence, the coupling capacitance produced at the gate sidewall spacers between the gate conductive layer and contact plug 120 is widely reduced. Moreover, damage to the low dielectric bottom portion 112a can be prevented because of the silicon nitride top portion 114a formed on the low electric bottom portion 112a.

In addition to being applied in the stacked gate layer for a word line, the stacked spacer structure of the present invention also can be applied in a bit line to reduce coupling capacitance between adjacent bit lines. FIGS. 2A–2D are schematic cross-sectional views according to another preferred embodiment of the present invention.

Figure 2A:
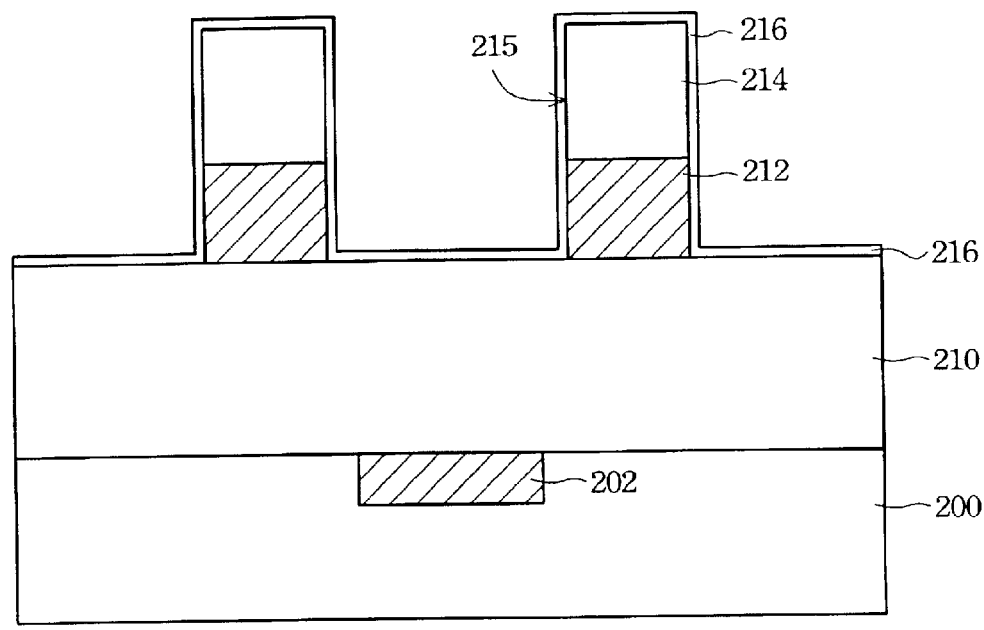
FIGS. 2A–2D are schematic, cross-sectional views according to another preferred embodiment of the present invention.

Referring to FIG. 2A, a semiconductor substrate 200 such as a silicon substrate with a <100> lattice orientation is provided. A certain amount of semiconductor devices, such as metal-semiconductor-oxide field effect transistors (MOSFET), have been formed on the substrate 200. The substrate 200 includes a conductive region 202, such as a source/drain region, a conductive landing pad, a conductive wire or other kinds of conductive regions. A dielectric layer 210, such as a silicon oxide layer or other material layers with low dielectric constant, is formed over the substrate 200 and covers the conductive region 202.

A stacked layer of bit line including a conductive layer and a cap layer is formed on the dielectric layer 210. The stacked layer can be fabricated, for example, by depositing a conductive layer 212 and a cap layer 214 in sequence. The conductive layer 212 can be made of polysilicon, aluminum, tungsten, copper or an alloy thereof. The cap layer 214 can be made of silicon nitride, silicon oxy-nitride or other materials having high etching selectivity to subsequently formed dielectric layer, and preferably be made of silicon nitride. Conventional photolithography and etching technologies are employed to define the desired pattern of the bit line stacked layers. A thin liner layer 216, such as a silicon nitride layer, having a thickness of about 3–30 nm can be optionally formed over the substrate 100 to cover the sidewalls 215 of the bit line stacked layer.

Figure 2B:
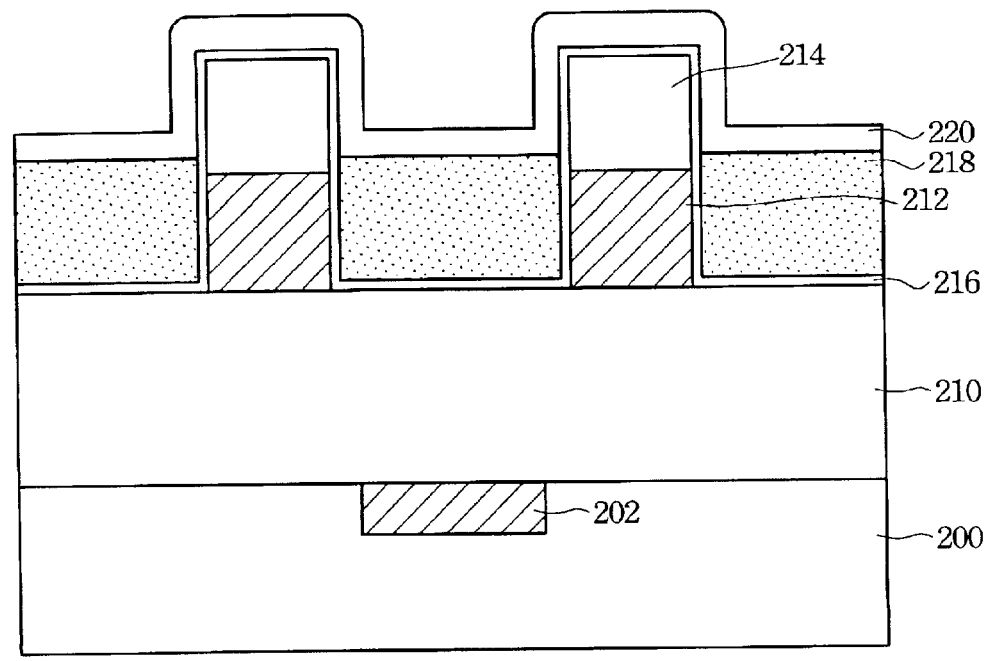

Referring to FIG. 2B, a dielectric layer 218 substantially higher than the conductive layer 212 is formed on the dielectric layer 210 in the access between adjacent bit line stacked layers. The dielectric layer 218 is made of a material with a low dielectric constant, such as silicon oxide having a dielectric constant of about 4, or another material having a dielectric constant lower than silicon oxide, for example, spin-on glass (SOG), spin-on polymer, etc., and the fabrication method is not limited. The dielectric layer 218 can be fabricated by the following steps. A dielectric layer is formed over the substrate 200, and then the portion of the dielectric layer on the stacked layer is removed by blanket etching back with a suitable etching rate to leave the required portion of the dielectric layer 218.

Another thin dielectric layer 220 along the topography of the substrate 200 is subsequently formed over the substrate 200. The thickness of the dielectric layer 220 can be precisely controlled to obtain thin gate sidewall spacers. The dielectric layer 220 can be made of silicon nitride, silicon oxy-nitride, or other materials having perfect thickness control and having high etching selectivity to subsequently formed dielectric layers, and preferably to silicon nitride. If the dielectric layer 220 is a silicon nitride layer made by chemical vapor deposition (CVD), the dielectric layer 114 will be much thinner and may even have a thickness of 5–60 nm or less because thickness control of the silicon nitride layer is better than that of silicon oxide layer.

Figure 2C:
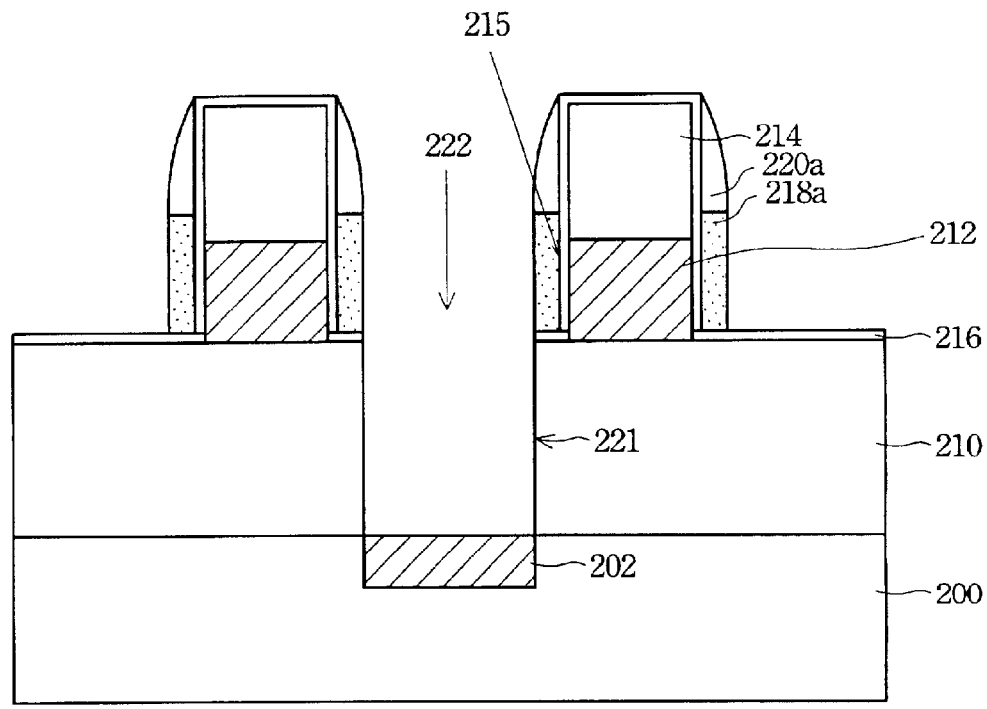

Referring to FIG. 2C, the dielectric layer 220 is then etched back to form a spacer top portion 220a on the sidewalls 215 of the bit line stacked layer. The portions of the dielectric layer 220 on the cap layer 214 and the dielectric layer 210 can be removed by a process such as reactive ion etching (RIE) to leave desired portions on the sidewalls of the stacked layer. The exposed portion of the underlying dielectric layer 218 is subsequently etched using the spacer top portion 220a as a mask to form a spacer bottom portion 218a thereunder. The resulting spacer top portion 220a and spacer bottom portion 218a construct an inner spacer on the sidewalls 215 of the stacked layer. The exposed portion of the dielectric layer 210 is continuously etched until the conductive region 202 is exposed to form a contact opening 222 in the dielectric layer 210. Since a material having a high selectivity to the dielectric layer 218 is deliberately selected for the spacer top portion 220a, less spacer top portion 220a is consumed during the etching process on the dielectric layer 218. The damage to the spacer top portion 220a is decreased.

Figure 2D:
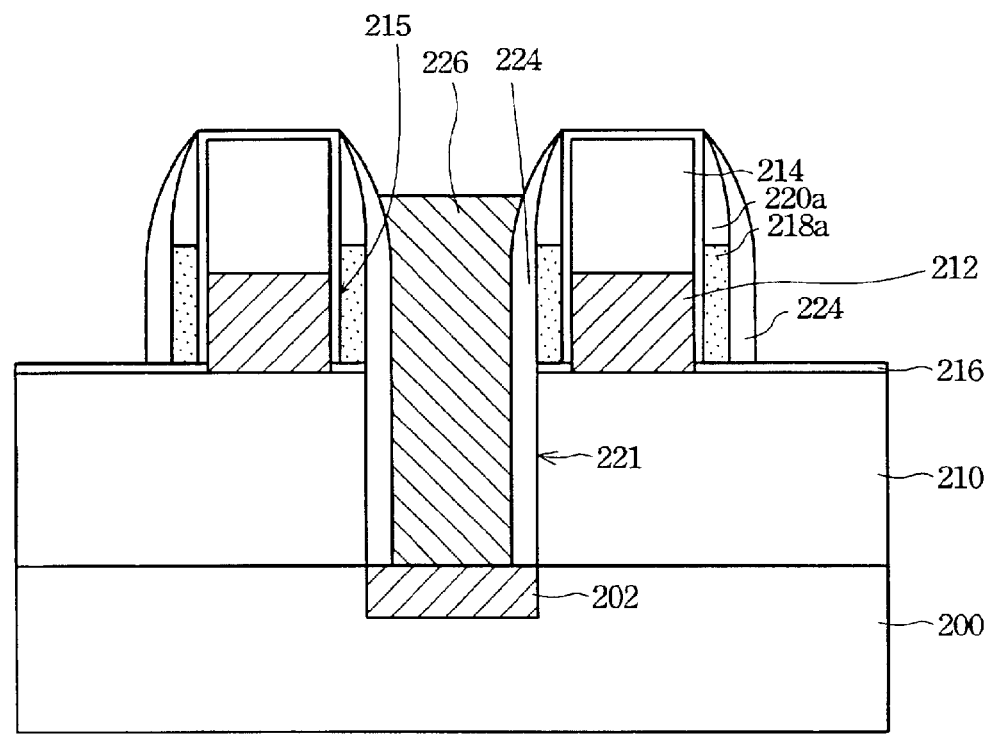

Referring to FIG. 2D, an outer spacer 224 is formed on the sidewalls of the inner spacer including the spacer top portion 220a and spacer bottom portion 218a. The outer spacer 224 is made of a material having high selectivity to subsequently formed dielectric layer, e.g., a silicon oxide layer. For example, the outer spacer 224 can be made of silicon nitride, silicon oxy-nitride and the like. The method of fabricating the outer spacer 224 can be according to the following exemplary steps. A silicon nitride layer is formed over the substrate 200 to cov r the inner spacer, and the sidewalls 221 and bottom of the contact opening 222. The portion of the silicon nitride layer on the cap layer 214 and on the bottom of the opening 222 is removed by an etching back process to leave the required portion covering the sidewalls of the inner spacer and the sidewalls 221 of the opening 222. The opening 222 is filled with a conductive material to form a contact plug 226 electrically connected to the conductive region 202.

Referring to FIG. 2D again, the stacked spacer structure is therefore provided according to the preferred embodiment of the present invention. The stacked spacer structure as described in the foregoing is formed on the sidewalls of the stacked layer and contact opening 222. The stacked layer includes the conductive layer 212 and the cap layer 214, wherein the cap layer 214 is referred to as a first dielectric layer. The stacked spacer structure of the present invention, as shown in FIG. 2-D, comprises second, third and fourth dielectric layers. The second dielectric is a low dielectric bottom portion, i.e., the spacer portion 218a described above, formed on the dielectric layer 210 and the sidewalls of the stacked layer. The low dielectric bottom portion 218a is equal to or is higher than the gate conductive layer 212, and is preferably a little higher than the conductive layer 212. The third dielectric layer is a silicon nitride top portion, i.e., the spacer top portion 220a described above, formed on the low dielectric bottom portion 218a and on the sidewalls of the stacked layer. The silicon nitride top portion 220a and the low dielectric bottom portion 218a construct the inner spacer. The fourth dielectric layer is a silicon nitrid outer portion, i.e., the outer spacer 224 described above, formed on the sidewalls of the silicon nitride top portion 220a and the low dielectric bottom portion 218a, and extended to cover the sidewalls of the contact opening 222 adjacent to the low dielectric bottom portion 218a.

Since the low dielectric bottom portion 218a has a dielectric constant lower than the silicon nitride top portion 220a and silicon nitride outer portion 224, the equivalent dielectric constant of the stacked spacer structure is lower than a spacer made of silicon nitride only. Accordingly, the effective spacer thickness of the stacked spacer structure becomes larger than the silicon nitride spacer does at the same width. Hence, the coupling capacitance produced at the sidewall spacers between the conductive layer 212 and contact plug 226 is greatly reduced. Moreover, the extended portion of the silicon nitride outer spacer 224 on the sidewalls 221 of the contact opening 222 can defend against oxide etchant corrosion to avoid broadening the contact opening 222.

According to above description, the present invention provides a stacked spacer structure and the formation process thereof. The low dielectric material is embedded into the high etching resist spacer, such as a silicon nitride spacer, to reduce coupling capacitance therein, and a narrower spacer structure can be formed. Moreover, the conductive layer is protected by the stacked spacer structure without damage during the etching processes.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method of fabricating a stacked spacer structure, comprising the steps of:
    providing a semiconductor substrate having a stacked layer, said stacked layer comprising a conductive layer and a cap layer thereon;
    forming a dielectric layer only on said semiconductor substrate, wherein a thickness of said dielectric layer is larger than a thickness of said conductive layer;
    forming a first silicon nitride layer over said semiconductor substrate;
    etching said first silicon nitride layer and said dielectric layer sequentially to form a first spacer on the sidewalls of said stacked layer;
    forming a second silicon nitride layer over said semiconductor substrate; and
    etching said second silicon nitride layer to form a second spacer on the sidewalls of said first spacer.

2. The method according to claim 1, wherein said cap layer comprises a silicon nitride layer.

3. The method according to claim 1, wherein said dielectric layer is made of a low dielectric material having a dielectric constant lower than that of silicon nitride.

4. The method according to claim 3, wherein said dielectric layer comprises a layer selected from the group consisting of a silicon oxide layer, a spin-on glass layer, and a spin-on polymer layer.

5. The method according to claim 1, further comprising forming a thin silicon nitride layer on the sidewalls of said stacked layer before forming said dielectric layer.

6. The method according to claim 1, wherein said stacked layer comprises a word line.

7. The method according to claim 6, further comprising forming a gate dielectric layer between said semiconductor substrate and said conductive layer.

8. The method according to claim 6, wherein said conductive layer comprises a polysilicon layer and a tungsten layer.

9. The method according to claim 1, wherein said stacked layer comprises a bit line.

10. The method according to claim 9, wherein a material of said conductive layer is selected from the group consisting of polysilicon, aluminum, tungsten, copper and a combination thereof.

11. The method according to claim 9, further comprising forming a contact hole adjacent to said first spacer after forming said first spacer.

12. The method according to claim 11, wherein said second spacer is extended to the sidewalls of said contact hole.

13. A method of fabricating a semiconductor structure, comprising the steps of:
    forming a stacked layer comprising a conductive layer and a first dielectric layer thereon on a semiconductor substrate;
    forming a second dielectric layer only on said semiconductor substrate, wherein a thickness of said second dielectric layer is larger than a thickness of said conductive layer;
    forming a third dielectric layer over said semiconductor substrate;
    etching said third dielectric layer and said second dielectric layer sequentially to form a first spacer on the sidewalls of said stacked layer;
    forming a fourth dielectric layer over said semiconductor substrate; and
    etching said fourth dielectric layer to form a second spacer on the sidewalls of said first spacer.

14. The method according to claim 13, wherein said first and third dielectric layers have high respective etching selectivity to said second dielectric layer.

15. The method according to claim 13, wherein a material of said first, third and fourth dielectric layers comprises silicon nitride.

16. The method according to claim 13, wherein said second dielectric layer has a dielectric constant lower than that of said first, third and fourth dielectric layers.

17. The method according to claim 16, wherein said second dielectric layer comprises a layer selected from the group consisting of a silicon oxide layer, a spin-on-glass layer, and a spin-on-polymer layer.

18. The method according to claim 13, further comprising forming a thin liner layer on the sidewalls of said stacked layer after forming said stacked layer.

19. The method according to claim 18, wherein a material of said liner layer comprises silicon nitride.

20. The method according to claim 13, wherein said stacked layer comprises a word line.

21. The method according to claim 20, further comprising forming a gate dielectric layer between said semiconductor substrate and said conductive layer.

22. The method according to claim 13, wherein said stacked layer comprises a bit line.

23. The method according to claim 22, further comprising forming a contact hole adjacent to said first spacer after forming said first spacer.

24. The method according to claim 23, wherein said second spacer is extended to the sidewalls of said contact hole.

* * * * *